POWER AMPLIFIER AND METHOD OF OPERATION

Filed Feb. 25, 1955

INVENTOR
MARTIN V. KIEBERT JR.
BY Eugene E. Geoffrey Jr.
ATTORNEY

Dec. 22, 1959 M. V. KIEBERT, JR 2,918,630

POWER AMPLIFIER AND METHOD OF OPERATION

Filed Feb. 25, 1955 2 Sheets-Sheet 2

INVENTOR
MARTIN V. KIEBERT JR.
BY [signature]
ATTORNEY 2,918,630

POWER AMPLIFIER AND METHOD OF OPERATION

Martin V. Kiebert, Jr., Pomona, Calif.

Application February 25, 1955, Serial No. 490,445

9 Claims. (Cl. 330—119)

Figure 1:
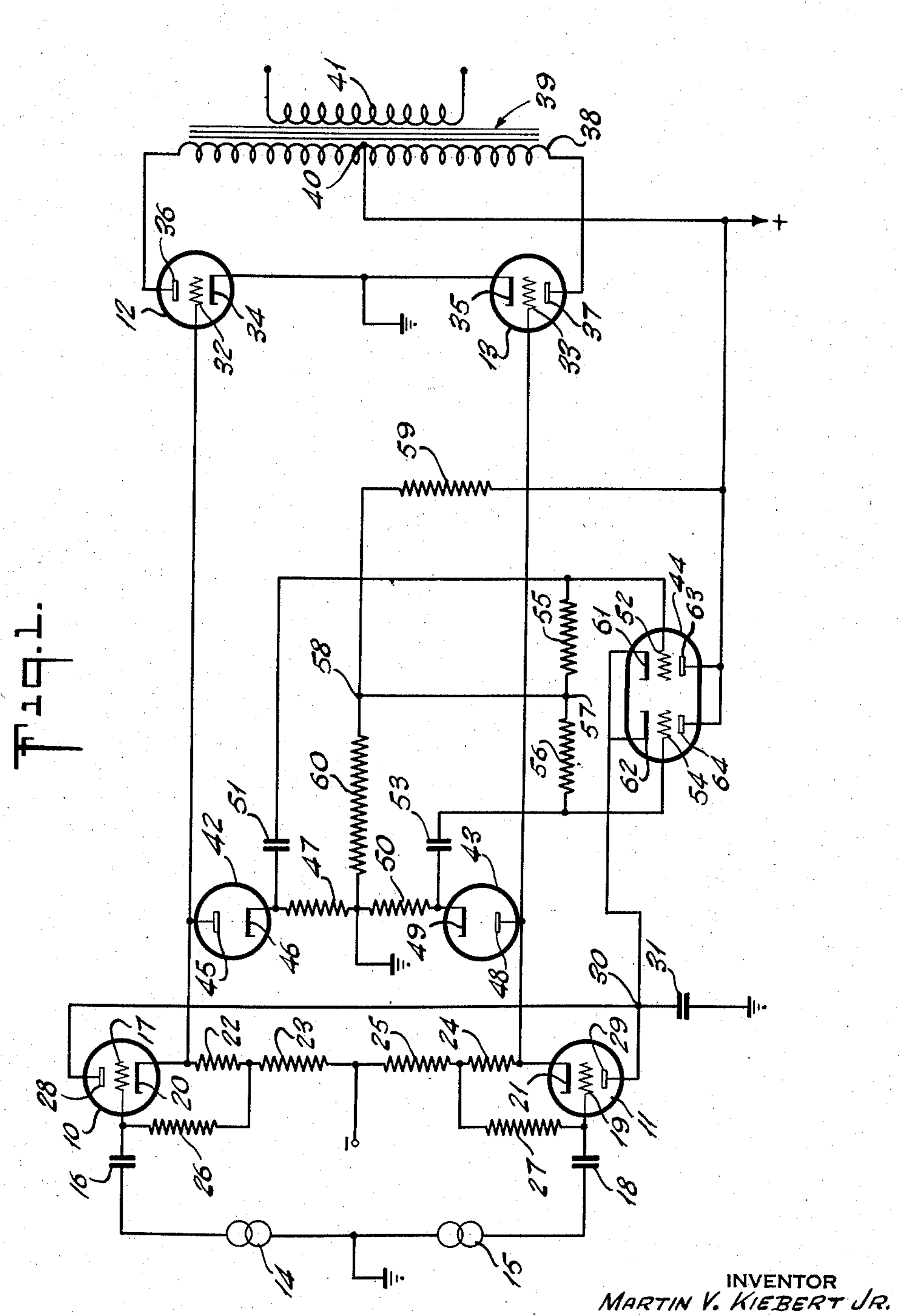

This invention relates to electronic amplifying devices and more specifically to an improved electronic driver and output circuit for the power amplifiers that provides a high degree of driving voltage regulation and control particularly important in driving a push-pull output stage in class AB and class B operation wherein the grids of the output tubes are driven into the positive or grid current range and at the same time obtain substantially distortionless operation over a wide range of power outputs.

In the design of class AB and class B amplifiers which are intended primarily for generating relatively high power ouput signals, it is essential that the grids of the output tubes be driven positively in order to produce the desired amount of power. In so doing however the grids actually draw substantial current and it is essential that the impedance of the grid circuits be maintained as low as possible in order to prevent undesirable voltage drops that introduce considerable distortion in the output signal. To overcome this problem transformer coupling is customarily employed but this is expensive and adds material additional weight to the complete unit. Moreover the use of transformers does not always overcome the regulation problem but in many cases merely minimizes it.

Accordingly, one object of the invention resides in the provision of an improved circuit and method of operation of signal amplifying means for driving a pair of output tubes in an audio amplifier to prevent distortion caused by relatively high grid currents in the output stage as a result of driving the grids positive with respect to the cathode or filament in order to attain increased power output. In this way the signal applied to the grids of the output tubes is always proportional to the signal being amplified.

While this improved regulation of the driver stage provides an improved low cost method of reducing distortion in class B amplifiers, such amplifiers can be used only at relatively high levels as distortion is encountered the relatively low signal levels because of the normally high negative bias applied to the tubes. Accordingly another object of the invention resides in the provision of an improved driver stage for high powered amplifying tubes that functions to modify the class of operation of the output tubes from class A to class B as the signal to be amplified increases in magnitude and at the same time providing means for regulating the output voltage of the driver tubes so that the output signal will be at all times proportional to the input signal notwithstanding the polarity of the grids of the output tubes relative to their cathodes. In this way a high power amplifier can be obtained that will automatically operate as a linear amplifier at low levels and as the level increases will continue to function as a linear amplifier but with a grid bias increased negatively in proportion to the increased signal applied to the grids. Thus a substantially distortion free amplifier capable of functioning over extremely wide power ranges is obtained.

The above and other objects of the invention will become more apparent from the following description and accompanying drawing forming part of this application.

Figure 2:
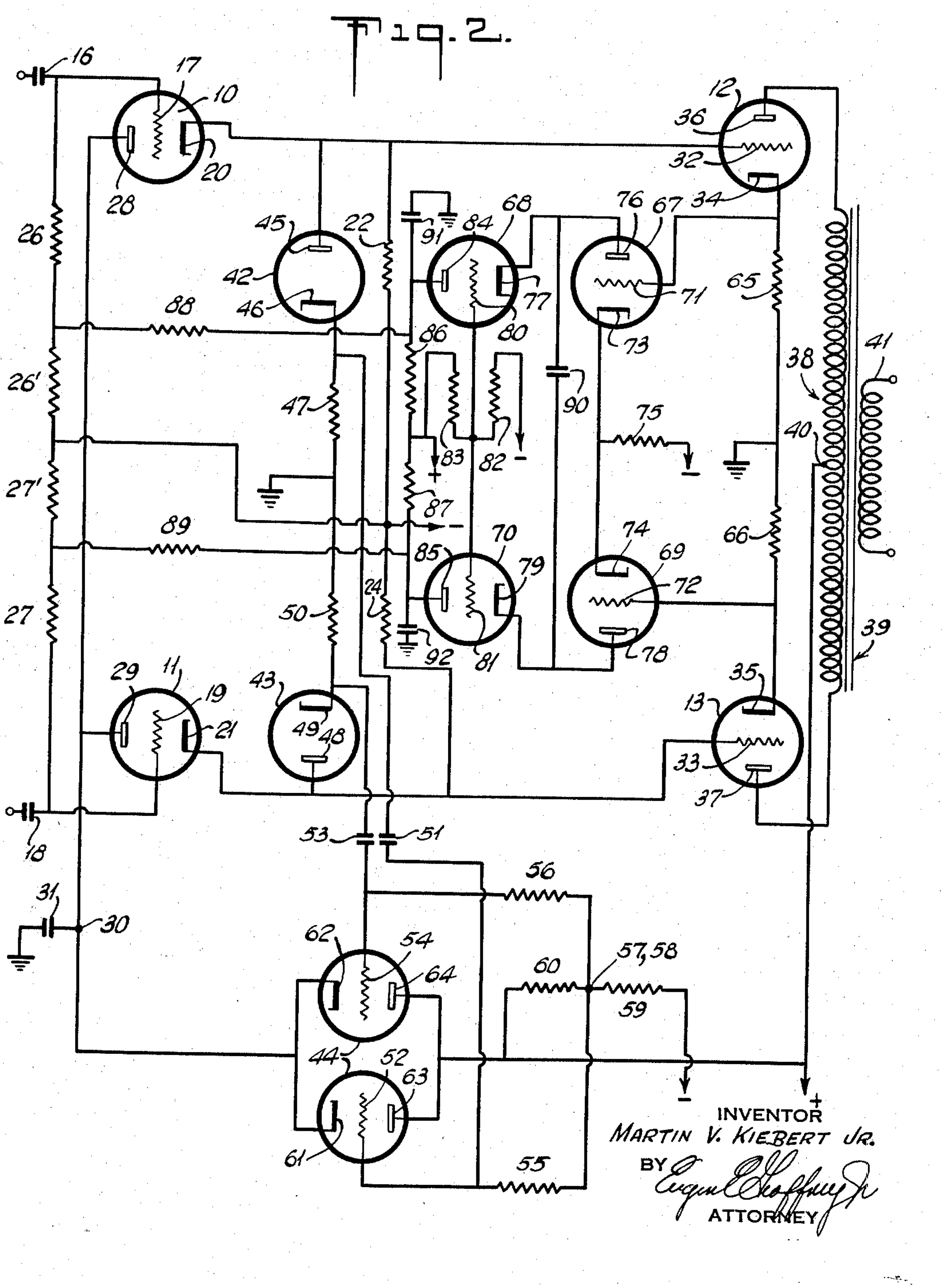

In the drawings:

Fig. 1 is a circuit diagram of one embodiment of the invention for regulating the operation of a driver stage that is particularly useful for driving the output tubes of an audio amplifier; and Fig. 2 is a circuit diagram of another embodiment of an amplifier in accordance with the invention.

Referring now to Fig. 1 the amplifier in accordance with the invention includes a pair of vacuum tubes 10 and 11 connected as cathode followers to drive a pair of output tubes 12 and 13. As will be shown the signals fed to the cathode followers 10 and 11 are 180° out of phase and will thus drive the cathode follower tubes 12 and 13 in so-called push-pull operation.

More specifically the input signal to the amplifier is represented by a pair of generators 14 and 15 which may represent the output of a push-pull pre-amplifier or an amplifier having a suitable phase inverter. Since such apparatus is well-known in the art the illustration thereof is deemed unnecessary. The significant factor at this point is that the generators 14 and 15 produce signals to be amplified that are 180° out of phase. The generator 14 is connected on one side to ground and on the other side through a blocking condenser 16 to the grid 17 to tube 10. The generator 15 is similarly connected to tube 11 by means of a blocking condenser 18 to the grid 19. The cathodes 20 and 21 are connected to a suitable negative potential through resistors 22, 23 and resistors 24, 25, respectively. The return circuit for the grid 17 is obtained by means of a resistor 26 connected to the junction of resistors 22 and 23 while the return circuit for the grid 19 is obtained by the resistor 27 connected to the junction of resistors 24 and 25. The plates 28 and 29 of the tubes 10 and 11 are connected together and to a high voltage terminal 30. This terminal is bypassed to ground by a condenser 31.

Considering the amplifier of Fig. 1 to be a so-called class B amplifier wherein the grids 32 and 33 of the output tubes 12 and 13 are intended to be driven positively it will be observed that since the grid 32 of the tube 12 is connected directly to the cathode 20 of tube 10 and since the grid 33 of tube 10 is connected directly to the cathode of tube 11 the cathode potentials of tubes 10 and 11 must be arranged so that they are at the desired negative potential to properly bias the tubes 12 and 13 for class B operation. The cathodes 34 and 35 of the tubes 12 and 13 are connected to ground while the plates 36 and 37 are connected through oppositely phased sections of the primary 38 of the output transformer 39. The center tap 40 of the output transformer is connected to a source of positive voltage and the signal generated by the tubes 12 and 13 will appear across the secondary winding 41 of the transformer 39.

The circuit thus far described constitutes substantially straight forward practice known in the art but it suffers a serious disadvantage in that the voltage in the cathodes 20 and 21 of the tubes 10 and 11 will vary in accordance with the current drawn by the grids 32 and 33 of the tubes 12 and 13 as the tubes function in the positive grid current region.

This invention provides a simplified and relatively low cost method for effectively controlling or regulating the output voltage of the drivers 10 and 11 so that the potentials of the cathodes 20 and 21 of the drivers will not vary in response to the magnitude of the grid current drawn by the output tubes. This end is attained by the use of a pair of diode rectifiers 42 and 43 and a dual triode 44. The rectifier 42 has its plate 45 connected to the cathode 20 of tube 10 and its cathode 46 through a resistor 47 to ground. The diode 43 is similarly connected with its plate 48 being coupled to the cathode 21 of tube 11 and its cathode 49 connected through a resistor 50 to ground. Since the diodes 42 and 43 may be any unidirectional current device, they will not draw current until the plates become positive with respect to the cathode and in this instance such positive voltage occurs when the grids 32 and 33 of the output tubes are driven positively. At this point both diodes will draw current and produce a voltage drop across their cathode resistors 47 and 50, respectively. These voltage drops are utilized by means of tube 44 to control the potential applied to the terminal 30 and thus the plates of the driver tubes 10 and 11. To attain this end the cathode 46 of tube 42 is connected by means of a condenser 51 to the grid 52 of tube 44 and the cathode 49 of diode 43 is connected through a condenser 53 to the grid 54 of tube 44. The grids 52 and 54 are positively biased by a pair of grid resistors 55 and 56 connected together at the terminal 57 which in turn is connected to a junction 58 of a voltage divider comprising resistors 59 and 60. The cathodes 61 and 62 of the tube 44 are connected together and to the terminal 30 while the plates 63 and 64 are connected together and to a source of positive potential.

In the selection of components for this regulation system it is preferable that the resistors 47 and 50 be of relatively high values with respect to the impedance of the cathode circuits of tubes 10 and 11 so that they will have negligible effect on the output of these driver tubes. The coupling condensers 51 and 53 and the associated resistors 55 and 56 are selected to produce a relatively large time constant in order to limit the rate of change of the voltage produced by the tube 44 and appearing at the terminal 30. This rate of change will of course be governed by the nature of the frequencies being handled by the amplifier.

With the circuit as described, as the signal applied to the grid 32, for instance, of tube 12 becomes more positive the diode 42 will draw current and produce a signal across its cathode resistor 47. This signal will be impressed on the grid 52 of tube 44 causing it to become more positive and thus reduce the impedance between the associated plate 63 and cathode 61. This functions to effectively reduce the impedance of the source of positive potential and thus increase the voltage at the terminal 30 and the plate 28 of tube 10. Increasing the voltage at this plate will of course increase the positive potential of the cathode 20 of tube 10 and cause the grid 32 to draw current through the tube 10. The presence of a positive potential on the grid 32 will apply a more positive signal to the tube 44 which then functions to immediately increase the plate voltage of tube 10 so as to maintain the voltage at grid 32 proportional to the generator voltage 14. This action occurs of course only during one half cycle and during the opposite half cycle the diode 43 comes into operation to again correct the potential of terminal 30 as the grid 33 goes into a positive region. By reason of a relatively large time constant in the grid circuits of tube 44 the diodes 42 and 43 cooperating therewith function to closely control the potential at the plates of the tubes 10 and 11 and thereby produce substantially distortionless operation of the tubes 12 and 13.

Referring now to Fig. 2 showing the utilization of the regulated driver circuit of Fig. 1 together with automatic bias control of the output tubes like elements of both figures have been denoted by like numerals and the operation of the regulation circuit is identical to that described in connection with Fig. 1. It will be observed in Fig. 2 that the circuit of Fig. 1 has been modified in certain respects namely the inclusion of additional resistors 26′ and 27′ in the grid return circuits for tubes 10 and 11, the addition of very low value resistors 65 and 66 in circuit with cathodes 34 and 35 of tubes 12 and 13 and the omission of resistors 23 and 25 in the cathode circuits of tubes 10 and 11.

The automatic bias control of the output tubes 12 and 13 as well as static balancing of these tubes is attained by means of two separate feed back circuits between the tubes 12 and 10 and between the tubes 13 and 11. The first feed back circuit includes the triodes 67 and 68 coupling the cathode 34 of tube 12 to the grid 17 of tube 10 while the second feed back circuit includes the tubes 69 and 70 coupling the cathode of tube 13 with the grid of tube 11. By proper selection of the components interconnecting the several tubes the plate currents of tubes 12 and 13 which are drawn through the primary windings 38 of the transformer 39 can be maintained in good static balance as well as providing automatic bias control. This is accomplished through direct coupling of the components so that the D.C. voltage applied to the grids of the output tubes can be controlled by means of the feed back system. By means of automatic bias control the bias on tubes 12 and 13 can be gradually increased on the grids of the output tubes as the signal applied to the tubes 10 and 11 is increased.

More specifically a push-pull input signal is applied to the tubes 10 and 11 through blocking condensers 11 and 18, respectively, connected to the grids 17 and 19 of the tubes 10 and 11. The grid return circuit for the grid 17 of tube 10 includes series connected resistors 26 and 26′ and a source of negative potential. The grid 19 of tube 11 is similarly connected to a source of negative potential through series connected resistors 27 and 27′. The plates 28 and 29 of tubes 10 and 11 are connected directly to a source of positive potential while the cathode 20 of tube 10 is connected to a negative supply through the cathode resistor 22. The cathode 21 of tube 11 is connected to a source of negative voltage through its cathode resistor 24.

The output signal from the cathode follower driver 10 is obtained from the cathode 20 and fed directly to the grid 32 of the output tube 12. Similarly the cathode 21 of the driver tube 11 is connected to the grid 33 of the output tube 13. Cathodes 34 and 35 of the tubes 12 and 13 are connected to ground through relative low value sampling resistors 65 and 66, respectively, that may be of the order of five ohms depending upon the magnitude of the plate currents in the output tubes. The plates 36 and 37 of the output tubes 12 and 13 are fed through the reversely phased primary windings 38 of the output transformer 39 which are in turn connected to a source of positive potential. It will be observed thus far that by properly biasing the tubes 10, 11, 12 and 13 that they will perform a normal amplifying function. For instance, the positive and negative supply voltages applied to the cathode driver follower 10 must be proportioned so that the cathode 20 of that tube is at a negative potential of the order required for the desired type of operation to be obtained from the output tube 12. In this connection the value of resistor 65 may need to be taken into consideration as it will have some effect on the potential of the cathode 34 since the bias or negative voltage applied to the grid is measured with respect to the cathode of the tube. The same requirements apply to the other half of this balanced amplifier involving tubes 11 and 13.

Referring now to the self-balancing and automatic bias control feed back circuits involving tubes 67 through 70, the grid 71 of the tube 67 is directly coupled to the cathode 34 of the tube 12 while the grid 72 of the tube 69 is connected directly to the cathode 35 of the tube 13. The cathodes 73 and 74 of the tubes 67 and 69 are coupled together and connected to a negative supply voltage through a common cathode resistor 75. The plate 76 of the tube 67 is connected to the cathode 77 of the tube 68 while the plate 78 of the tube 69 is connected to the cathode 79 of tube 70. The tubes 68 and 70 are connected as cascode D.C. amplifiers with the grids 80 and 81, respectively, being connected together and to the junction of resistors 82 and 83 for applying fixed positive voltage. If desired these grids 80 and 81 may be returned directly to their respective cathodes.

The plates or anodes 84 and 85 of the tubes 68 and 70 are connected through plate resistors 86 and 87, respectively, to a source of positive potential. In addition the plate 84 of tube 68 is connected through resistor 88 to the junction of grid resistors 26 and 26′ of tube 10 and the plate 85 of tube 70 is connected through a resistor 89 to the junction of resistors 27 and 27′ in the grid circuit of tube 11.

Considering the upper half of the feed back circuit involving tubes 67 and 68, the tube 68 functions in cooperation with the triode 67 to provide added gain in the feed back circuit without encountering phase reversal. The gain of tube 67 is approximately $$\frac{\mu R_L}{R_L - R_p}$$

where $\mu$ is the amplification factor $R_L$ is the load impedance on the tube and $R_p$ is the internal plate resistance of the tube.

The gain of the feed back circuit with the cascode amplifier tube 68 in the plate circuit of tube 67 is $$\frac{\mu^2 R_L}{R_L + R_p}$$

While the filament circuits have been omitted from this figure for simplicity the tubes are of course provided with suitable filaments for heating the cathodes in accordance with conventional practice. While the tubes 12 and 13 are illustrated as indirectly heated tubes they may of course be filament type tubes with separate voltage supplies for each tube. In addition two or more output tubes 12 and 13 may be employed in cases requiring additional power output.

With the circuit as described above, and with no input applied to the grids of the driver tubes 10 and 11, the current through the cathode resistors 22 and 24 will determine the bias on the grids of the output tubes 12 and 13. The current in the plate circuits of these output tubes will be a function of this bias voltage and the potential of the cathodes 34 and 35 of the output tubes. Now assuming that the output tubes 12 and 13 are unbalanced with the tube 12 drawing more current than tube 13. This will cause the cathode 34 to assume a positive potential higher than that of the cathode 35. Since the plate current of tube 67 varies with the potential of cathode 34 it will draw more plate current through the tube 68 and plate resistor 86. The reduction of the potential at the plate 84 of tube 68 decreases the current through grid resistor 26′ with the result that the grid 17 of tube 10 becomes more negative. The current through the cathode resistor 22 of tube 10 is thereby decreased, the cathode 20 of tube 10 and grid 32 of tube 12 become more negative and the plate current of tube 12 is decreased.

Simultaneously with the foregoing action the plate current of the output tube 13 is increased through the action of the common cathode resistor 75 for the tubes 67 and 69. Thus under a condition where the tube 67 draws more current both cathodes 73 and 74 become more positive and effectively increases the negative bias on grid 72 of the tube 69 so that the grid 33 of output tube 13 will become more positive and cause the tube 13 to draw more plate current. In this way automatic static balance is attained.

As previously pointed out, the feed back circuits of this amplifier are utilized to modify the class of operation of the output tubes 12 and 13. For this purpose the circuit includes a condenser 90 between the plates 76 and 78 of tubes 67 and 69 and condensers 91 and 92 from the plates of tubes 68 and 70 to ground. These condensers increase the time constant of the circuit so that the bias on the output tubes 12 and 13 will gradually become more and more negative as the signal being amplified is increased and thus maintain output tube operation at all times along the straight portion of the grid voltage plate current curve. Thus the class of operation of the output tubes is a direct function of the signal level applied to tubes 10 and 11.

It is significant to note that with the condensers 90, 91 and 92 omitted, the time constant of the feed back circuit is very small and only static balancing is obtained. With the condensers as described above dynamic control of the bias of the output tubes is obtained since the long time constant will sustain the feed back voltages. Furthermore the required D.C. component amplified by the feed back circuit to attain a change in bias results from the rectification produced by the output tubes themselves since in push-pull operation the plate current variations of each tube are not symmetrical about a central value and therefore the differences between the positive and negative changes in plate current results in a D.C. component proportional to the asymmetrical nature of these variations.

It is apparent from the above that the circuit of Fig. 2 will provide an amplifier that will produce substantially distortionless operation at outputs ranging from a fraction of a watt to more than one hundred watts depending upon the character and number of the output tubes 12 and 13 employed and that when the operation of the output tubes is moved into class B and the grids draw current, excellent regulation is automatically provided.

While only two embodiments of the invention has been illustrated and described it is apparent that modifications, alterations and changes may be made without departing from the true scope and spirit thereof.

What is claimed is:

1. An amplifier comprising at least two output tubes connected in push-pull each having a plate, cathode and grid, a pair of cathode follower driver tubes each having a plate, cathode and grid, connections between the cathodes of each driver tube and the grid of one of said output tubes, connections between the cathodes of each output tube and ground, a rectifier and series resistor connected between the grid of each output tube and ground, means for supplying direct current to the plates of said driver tubes including a variable impedance device and connections between said rectifiers and said variable impedance device to reduce the impedance of said device as the polarity of the grid of said output tubes becomes positive with respect to their associated cathodes.

2. An amplifier according to claim 1 wherein said variable impedance device comprises at least two tubes each having a plate, grid and cathode, a common connection between the last said cathodes and the plates of said driver tubes, connections between the plates of said two tubes and a source of voltage and connections between each of the last said grids and one of said rectifiers, whereby the impedance of the tubes forming said variable impedance device decreases as the rectifiers become conductive.

3. An amplifier according to claim 2 wherein condenser coupling is utilized between said rectifiers and grids of said variable impedance device to produce a time constant substantially greater than that represented by the time duration of a single cycle of the lowest frequency to be amplified by said amplifier.

4. An amplifier comprising a pair of output tubes connected in push-pull and each having a plate at least one grid and a cathode, output means for coupling said plates in push pull and applying a positive potential thereto, a pair of driver tubes each having a plate at least one grid and a cathode, means for applying for push-pull input signal to the grids of said driver tubes, means including a resistor for connecting each driver cathode to a source of negative voltage, a variable impedance voltage supply for applying a positive potential to the plates of said driver tubes, connections between the cathode of each driver tube and the grid of its associated output tube, said driver tubes being adjusted so that the potential of their cathodes provide a predetermined negative potential for the grids of said output tubes, at least two rectifiers connected between the grid and cathode circuits of each output tube and arranged to conduct a current when its associated grid becomes positive, a resistor in series with each rectifier and a condenser coupling each rectifier and said variable impedance means whereby the impedance of said variable impedance means will decrease proportionately with the increase in current passing through said rectifiers and the signal voltage applied to the grids of said output tubes will vary proportionately with the input signal to the grids of said driver tubes.

5. An amplifier according to claim 4, wherein said variable impedance means comprises a pair of triodes each having a plate, grid and cathode and means for biasing the grids of said triodes positively, said bias being increased as the signal amplitude applied to the grids of the output tubes increases positively beyond a point of zero potential with respect to the cathode of said output tubes.

6. An amplifier according to claim 4 wherein the cathode circuits of said output tubes include a relatively small series resistor and a feedback circuit including at least one amplifier tube is interconnected with the cathode of each output tube and the associated driver tube to modify the operation of said driver tube to increase the effective bias of the output tube in a negative direction as the signal being amplified increases in magnitude.

7. An amplifier comprising a push-pull output stage, a push-pull cathode follower driver stage directly coupled with the output stage for transmission of D.C., variable impedance means for supplying an operating voltage to the driver stage, means for modifying the impedance of said variable impedance means in accordance with the magnitude of the signal applied to the said output stage to maintain the effective input impedance to the output stage substantially constant, and direct current feedback means including a differential amplifier between said push-pull output and driver stages whereby the operating characteristics of the output stage are modified in accordance with the magnitude of the signal applied to said output stage and said push-pull output stage is maintained in static balance.

8. An amplifier comprising a pair of output tubes connected in push-pull and each having a plate at least one grid and a cathode, output means for coupling said plates in push pull and applying a positive potential thereto, connections between the cathodes of said output tubes and ground, a pair of driver tubes each having a plate at least one grid and a cathode, means for applying a push-pull input signal to the grids of said driver tubes, means including a resistor for connecting each driver cathode to a source of negative voltage, a variable impedance voltage supply for applying a positive potential to the plates of said driver tubes, connection between the cathode of each driver tube and the grid of its associated output tube, said driver tubes being adjusted so that the potential of their cathodes provide the desired negative potential for the grids of said output tubes, a rectifier connected between the grid and cathode of each output tube and arranged to conduct a current when the associated grid becomes positive, a resistor in series with each rectifier, a condenser coupling each rectifier with said variable impedance means, the impedance of said variable impedance means decreasing proportionately with the increase in current passing through said rectifiers to cause the signal voltage applied to the grids of said output tubes to vary proportionately with the input signal to the grids of said driver tubes, a relatively small value resistor in series with the cathode of each output tube and feedback means between the cathode of each output tube and its associated driver, including an amplifier tube having a plate at least one grid and a cathode, a connection between the grid of the last said tube and the cathode of the associated output tube, a cascode amplifier interconnected with the plate of the last said amplifier tube and the grid circuit of one of said driver tubes and at least one condenser in feedback circuit for increasing the time constant thereof, said feedback circuits functioning to increase the potential difference between the grid and the cathode of each output tube as the signal applied to the grids of output tubes increases whereby dynamic bias control is effected to modify the operation of said output tubes as the magnitude of the input signal increases and at the same time the magnitude of the input signal fed to said output tubes will be maintained in an exact proportional relation with the magnitude of the input signal to the said driver tubes so that the output of amplifier will be substantially distortionless throughout its entire power range.

9. An amplifier comprising a pair of output amplifying devices connected in push pull, at least one cathode follower amplifying device having an output terminal directly coupled to each of said output devices for the transmission of direct current, a voltage supply for said driver devices, variable impedance means interconnected with said voltage supply for varying the voltage on said driver devices and individual rectifying means interconnected with each output terminal and with said variable impedance means for changing the voltage on said cathode follower devices in accordance with changes in the magnitude of the signal being amplified and thereby maintain the effective input impedance to said output devices substantially constant over wide ranges of signal amplitude.

References Cited in the file of this patent

UNITED STATES PATENTS

| | | |
|---|---|---|
| 2,175,990 | Hirsch | Oct. 10, 1939 |
| 2,226,746 | Schulze-Herringen | Dec. 31, 1940 |
| 2,338,410 | Cousins | Jan. 4, 1944 |
| 2,339,466 | Duft | Jan. 18, 1944 |
| 2,470,219 | McNaughton | May 17, 1949 |
| 2,475,258 | Scott | July 5, 1949 |
| 2,516,181 | Bruene | July 25, 1950 |
| 2,543,819 | Williams | Mar. 6, 1951 |
| 2,554,279 | Tharp | May 22, 1951 |